(12) United States Patent
Franz et al.

(10) Patent No.: US 11,877,422 B2
(45) Date of Patent: Jan. 16, 2024

(54) MEMORY COOLER

(71) Applicant: HEWLETT PACKARD ENTERPRISE DEVELOPMENT LP, Houston, TX (US)

(72) Inventors: John Franz, Houston, TX (US); Ernesto Ferrer, Houston, TX (US); Tahir Cader, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 234 days.

(21) Appl. No.: 17/399,940

(22) Filed: Aug. 11, 2021

(65) Prior Publication Data

US 2023/0047496 A1    Feb. 16, 2023

(51) Int. Cl.
*H05K 7/20* (2006.01)
*F28F 9/02* (2006.01)
*H05K 1/02* (2006.01)

(52) U.S. Cl.
CPC ....... *H05K 7/20272* (2013.01); *F28F 9/0224* (2013.01); *F28F 9/0248* (2013.01); *H05K 1/0203* (2013.01); *H05K 7/20218* (2013.01); *H05K 7/20254* (2013.01); *H05K 2201/10159* (2013.01)

(58) Field of Classification Search
CPC .......... H05K 7/20272; H05K 7/20218; H05K 7/20254; H05K 1/0203; H05K 2201/10159; F28F 9/0224; F28F 9/0248
USPC ................................................... 361/679.31
See application file for complete search history.

(56) References Cited

U.S. PATENT DOCUMENTS

| 8,638,559 | B2 | 1/2014 | Barina et al. |
| 8,659,897 | B2 | 2/2014 | Meijer et al. |
| 10,368,430 | B2 | 7/2019 | Ho et al. |
| 2009/0080159 | A1* | 3/2009 | Ippoushi ............... H01L 23/473 361/702 |

(Continued)

FOREIGN PATENT DOCUMENTS

EP    3153808 A1    4/2017

OTHER PUBLICATIONS

Poly-Shape, "Cold Plate," Case Study, Aluminum AS7, retrieved online Mar. 4, 2021, https://www.poly-shape.com/wp-content/uploads/2019/11/cs-plaq-froidevGB.pdf.

*Primary Examiner* — Anatoly Vortman
*Assistant Examiner* — Zhengfu J Feng
(74) *Attorney, Agent, or Firm* — Nolte Lackenbach Siegel

(57) ABSTRACT

A memory cooler includes a unitary thermal transfer device and a pair of endcaps. The unitary thermal transfer device includes heat transfer tubes, a first end block, a second end block, an inlet chamber, an outlet chamber, an inlet, and an outlet. The first and second end blocks are structurally integrated with each of the heat transfer tubes. The inlet and outlet chambers are partially defined by either the first end block or the second end block. Each of the inlet and outlet chambers are fluidly coupled with the respective liquid flow channel of the at least one heat transfer tube. The respective flow channels to which the inlet and outlet chambers are coupled may be the same or different to define either a direct or a serpentine flow path. Each endcap is affixed to a respective one of the first end block and the second end block to define, in conjunction with the first end block and second end block, the inlet chamber and the outlet chamber.

15 Claims, 11 Drawing Sheets

(56) References Cited

U.S. PATENT DOCUMENTS

| | | | |
|---|---|---|---|
| 2009/0237883 A1* | 9/2009 | Wei | G06F 1/20 |
| | | | 361/699 |
| 2013/0194745 A1* | 8/2013 | Meijer | G06F 1/20 |
| | | | 361/679.47 |
| 2015/0109729 A1* | 4/2015 | Campbell | H05K 7/20772 |
| | | | 361/679.47 |
| 2017/0347486 A1* | 11/2017 | Schaltz | G06F 1/20 |
| 2018/0084672 A1* | 3/2018 | Berk | G06F 1/20 |
| 2020/0003497 A1 | 1/2020 | Aston et al. | |
| 2020/0383238 A1 | 12/2020 | Chan et al. | |
| 2021/0321528 A1* | 10/2021 | Curtis | H05K 5/0021 |

\* cited by examiner

MEMORY COOLER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

This section of this document introduces information about and/or from the art that may provide context for or be related to the subject matter described herein and/or claimed below. It provides background information to facilitate a better understanding of the various aspects of the present invention. This is therefore a discussion of "related" art. That such art is related in no way implies that it is also "prior" art. The related art may or may not be prior art. The discussion in this section of this document is to be read in this light, and not as admissions of prior art.

The evolution of computing power as computational technology advances is, in many ways, a function of ever-increasing power consumption in larger, more powerful computing devices and systems. In particular, high performance computing ("HPC") systems experience this increased power consumption. Increased power consumption is typically accompanied by greater heat generation. Heat can be an issue for electronic components' operating efficiency and lifespan. Designers of computing devices therefore study and implement techniques for disposing of excess heat generated by electronic components to keep their operating conditions within specification. As heat generation increases in newer designs for computing devices, new techniques and devices for managing and disposing of excess heat are continually being sought.

BRIEF DESCRIPTION OF THE DRAWINGS

The invention may be understood by reference to the following description taken in conjunction with the accompanying drawings, in which like reference numerals identify like elements, and in which.

Figure 1:
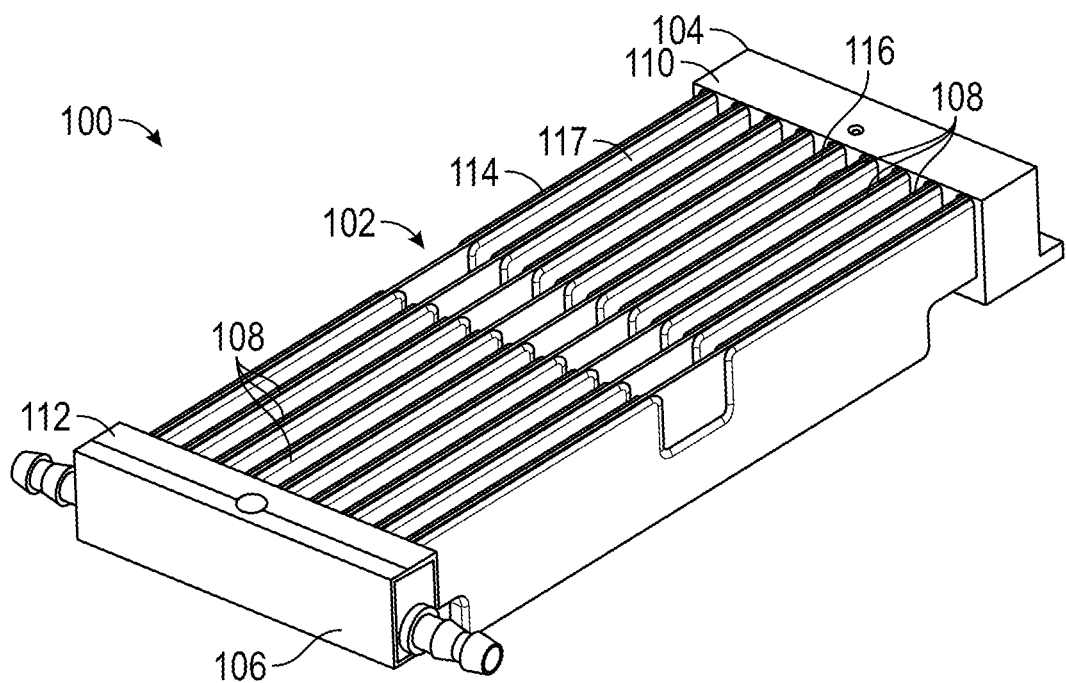
FIG. 1 is a perspective, assembled view of a memory cooler according to one or more examples disclosed herein.

While the invention is susceptible to various modifications and alternative forms, the drawings illustrate specific examples herein described in detail by way of example. It should be understood, however, that the description herein of specific examples is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Many computing systems employ Double Data Rate ("DDR") and Synchronous Dynamic Random-Access Memory ("SDRAM"). One widely-used, popular variation of the DDR memory is DDR4, so-called because it is considered a fourth generation of DDR memory. The industry is in the process of moving to DDR5, considered a fifth generation, as a part of the aforementioned evolution in computing systems. Both DDR4 and DDR5 are defined by one or more industry standards.

Both DDR4 and DDR5 are frequently deployed in what are known as Dual Inline Memory Modules ("DIMMs"). Note that, in this context, the term "module" has a definite, structural connotation to those in the art—namely, a plurality of Integrated Circuit ("IC") chips and supporting electronics mounted to a Printed Circuit Board ("PCB"). In case of a memory module such as a DIMM, the IC chips are memory chips. In other cases, a module may be, for instance, a processing module centered around a processing resource rather than a memory resource. Such modules may also be more generally referred to as a Printed Circuit Assembly ("PGA"). Finally, a collection of PCAs and supporting elements mounted to a "host board" may sometimes generally be referred to as a "compute module" or a "compute node".

The cooling challenges from DDR4 DIMMs to DDR5 DIMMs have increased dramatically. For instance, DDR5 power consumption may increase by at least 100%, from 6-9 W for DDR4 to 12-20 W for DDR5. DDR5 DIMMs may also see a 20% reduction in pitch from 9.4 mm for DDR4 down to 7.4 mm for DDR5. In addition, DDR5 may see an increase in the number of DIMMs per CPU, for as many as 12 DIMMs per Central Processing Unit ("CPU") for DDR5, up from 8 DIMMs per CPU for DDR4. Furthermore, CPU socket size is increasing, thereby reducing space for the DIMMs, and PCA routing restrictions are shifting memory closer to the outer edges of the compute node. Still further, system fluid temperature targets (inlet to the liquid-cooled information technology ("IT") hardware) will rise to 27° C. from 32° C. and there will be a more limited ability to increase fluid flow per compute node.

These kinds of increases in power consumption and in quantity and density of components concomitantly increase heat generation. Managing the heat as described above then becomes more difficult and challenges the current techniques used for that purpose. The industry has resorted to liquid-cooling DIMMs for HPC systems using a variety of thermal management devices to circulate and deliver liquid coolant. The predominant manufacturing technique is to use machined copper parts that are soldered or brazed together at numerous points, resulting in a large number of potential leak points. The machined copper solutions are also heavy, expensive, and labor-intensive to assemble.

The present disclosure provides a memory cooler that addresses some or all of the concerns discussed above. In various examples, a memory cooler is provided that includes only three parts, each of which may be 3D printed of stainless steel. Other examples may use other additive manufacturing process as well as other materials as described more fully below. The bulk of the memory cooler is a unitary thermal transfer device. As used herein, terms such as "unitary" and "structurally integrated" mean that the thermal transfer device is constructed of a single piece.

More particularly, a memory cooler includes a unitary thermal transfer device and a pair of endcaps. The unitary thermal transfer device includes a plurality of heat transfer tubes, a first end block, a second end block, an inlet chamber, an outlet chamber, an inlet to the inlet chamber, and an outlet from the outlet chamber. Each heat transfer tube has a first tube end and a second tube end and defines a respective liquid flow channel.

The first end block and the second end block are structurally integrated with each of the plurality of heat transfer tubes at respective first and second tube ends of the at least one heat transfer tube. The inlet chamber is partially defined by one of the first end block and the second end block, and the inlet chamber is fluidly coupled with at least one respective liquid flow channel of at least one of the heat transfer tubes. The outlet chamber is partially defined by one of the first end block and the second end block, and the outlet chamber is fluidly coupled with at least one respective liquid flow channel of at least one of the heat transfer tubes. Each endcap is affixed to a respective one of the first end block and the second end block to define, in conjunction with the first end block and second end block, the inlet chamber and the outlet chamber.

In a second example, an assembly includes a host printed circuit board ("PCB"), a memory cooler, and a plurality of memory boards. The memory boards may be dual inline memory modules ("DIMMs") in various examples. The memory boards are plugged into the host board, each memory board being disposed in a respective slot defined by the heat transfer tubes of the unitary thermal transfer device. The memory cooler includes a unitary thermal transfer device and a pair of endcaps as described immediately above.

In another example, a method for manufacturing a memory cooler includes developing a digital, three-dimensional ("3D") model of a memory cooler including a unitary thermal transfer device, a first endcap, and a second endcap; fabricating the unitary thermal transfer device, the first endcap, and the second endcap using an additive manufacturing process; and affixing the first endcap and the second endcap to the unitary thermal transfer device. The memory cooler includes a unitary thermal transfer device and a pair of endcaps as described immediately above.

The subject matter claimed below will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention to further an understanding of that which is claimed below. The claimed subject matter nevertheless is not limited to the disclosed examples.

Figure 2:
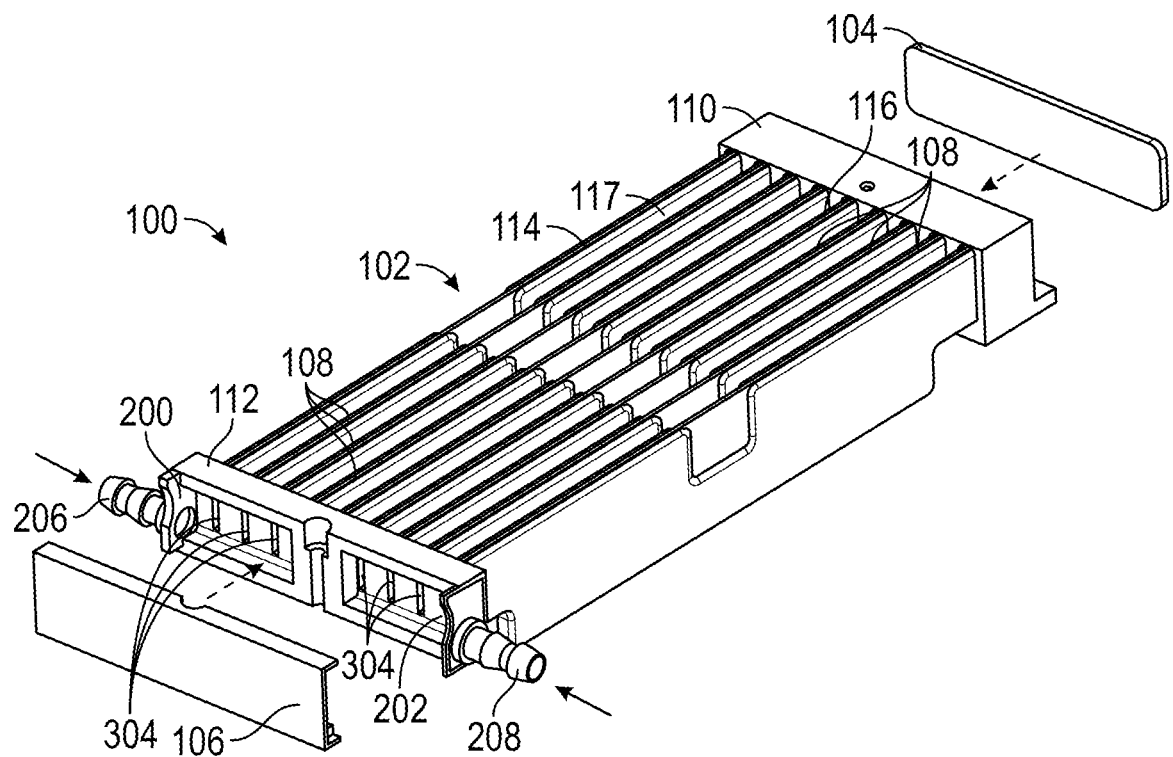
FIG. 2 is a perspective, exploded view of the memory cooler of FIG. 1.

FIG. 1 is a perspective, assembled view of a memory cooler 100 according to one or more examples disclosed herein and FIG. 2 is a perspective, exploded view of the memory cooler 100 of FIG. 1. The memory cooler 100 includes a unitary thermal transfer device 102, a first endcap 104, and a second endcap 106. As best shown in FIG. 2, the unitary thermal transfer device 102 is fabricated in a single piece as discussed further below. Thus, the memory cooler 100 comprises only three pieces (i.e., the unitary thermal transfer device 102 with two endcaps 104, 106) in this example.

The unitary thermal transfer device 102 includes a plurality of heat transfer tubes 108, a first end block 110, a second end block 112, a pair of side rails 114, and a mid-rail 116. The unitary thermal transfer device 102 is fabricated as a single piece. Accordingly, the heat transfer tubes 108, side rails 114, and mid-rail 116 are all structurally integrated with the first end block 110 and the second end block 112. This fabrication is performed using an additive manufacturing process such as a three-dimensional ("3D") printing process described further below. The heat transfer tubes 108, side rails 114, and mid-rail 116 define a plurality of slots 117 (only one indicated) in which printed circuit assemblies ("PCAs")—such as DIMMS—may be disposed as discussed further below relative to FIGS. 6A-6C.

Figure 3:
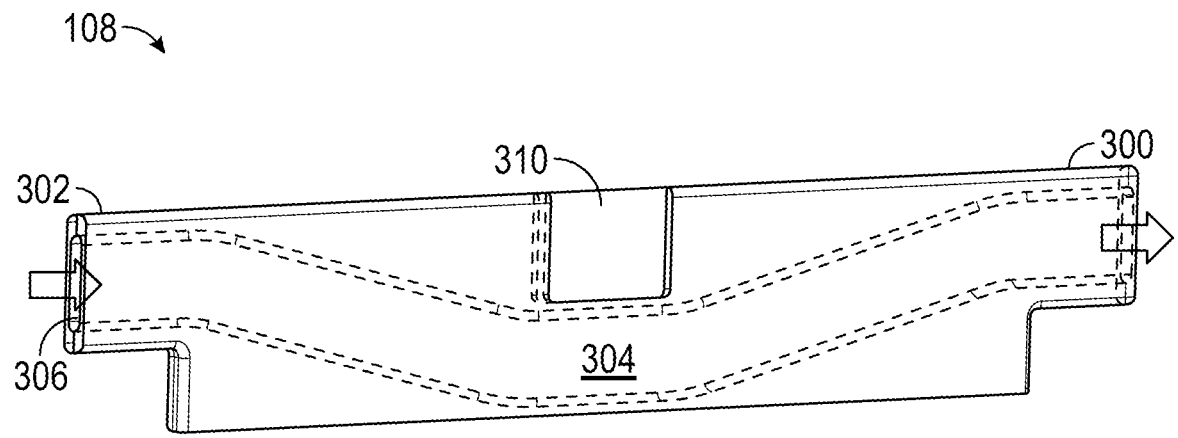
FIG. 3 illustrates one particular example of a heat transfer tube as may be used in the example memory cooler of FIG. 1-FIG. 2.

As best shown in FIG. 3, each heat transfer tube 108 is, in this particular example, a heat transfer tube having a rounded rectangular-shaped cross-section 306. Alternative examples, however, may have cross-sections of alternative geometries. Each heat transfer tube 108 has a respective first tube end 300 and a respective second tube end 302 that define a respective liquid flow channel 304 therebetween. The liquid flow channel 304 is internal to the body of the heat transfer tube 108 but is shown here in unbroken lines for the sake of clarity. As will be discussed further below relative to FIG. 7, during operation, a liquid coolant flows through the liquid flow channel 304 to remove heat generated by electronic components. The heat transfer tube 108 furthermore includes an optional cutout 310 to accommodate the height of electronic components of the DIMM.

Figure 4:
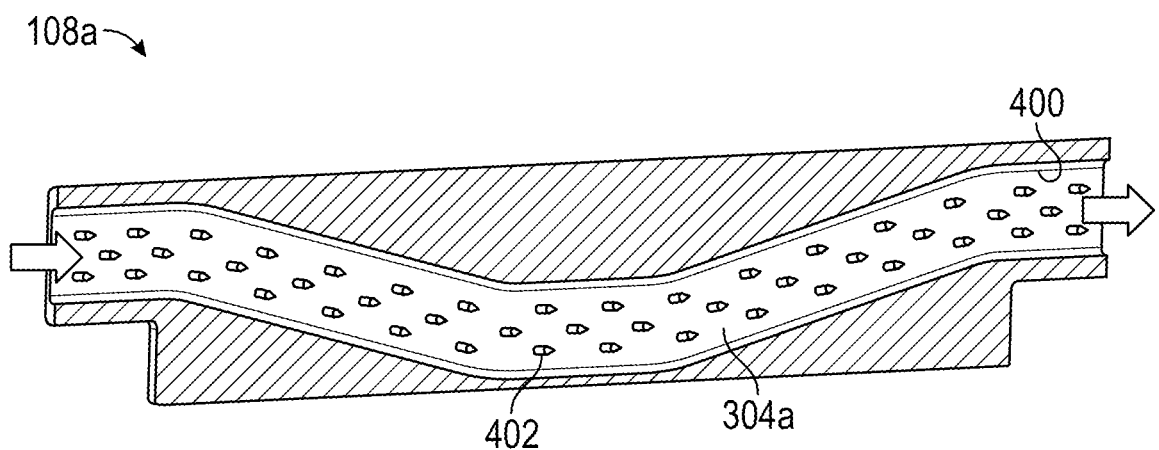
FIG. 4 illustrates a second particular example of a heat transfer tube alternative to that in FIG. 3 as may be used in the example memory cooler of FIG. 1-FIG. 2.

In some examples, the interior surface of the liquid flow channel may include surface extensions to promote heat transfer. FIG. 4 illustrates one such example in which a heat transfer tube 108a defines a liquid flow channel 304a. The interior surface 400 of the liquid flow channel 304a defines a plurality of surface extensions 402. In the illustrated example, the surface extensions are "fins" and, collectively, may be referred to as a "fin array". Other examples may use other types of surface extensions. For instance, some examples may use ridges or buttons instead of fins. The number and spatial distribution of the surface extensions will be implementation specific depending on the desired thermal transfer and flow specifications and can be determined through modeling or otherwise.

Returning to FIG. 1-FIG. 2, the first end block 110 is structurally integrated with each of the plurality of heat transfer tubes 108. More particularly, the first end block 110 is structurally integrated at a respective first tube end 300 of the heat transfer tubes 108. The second end block 112 is structurally integrated with each of the heat transfer tubes 108 at a respective second tube end 302, shown in FIG. 3. Thus, the unitary thermal transfer device 102 is "unitary" in the sense that the first and second end blocks 110, 112, are each structurally integrated with each of the heat transfer tubes 108 such that it is fabricated as a single piece.

The first end block 110 partially defines a circulation chamber (shown in FIG. 7) fluidly coupling with each respective liquid flow channel 304 defined by each of the structurally integrated heat transfer tubes 108. The second end block 112 partially defines an inlet chamber 200 fluidly coupling with a first portion of the liquid flow channels 304 and an outlet chamber 202 fluidly coupling with a second portion of the liquid flow channels 304. The second end block 112 also includes an inlet hose barb 206 and an outlet hose barb 208, shown in FIG. 2. The inlet hose barb 206 and the outlet hose barb 208 are also structurally integrated with the second end block 112. Note that other examples might use some other type of 3D-printable connection.

The characterizations "inlet" and "outlet" are for convenience only and are related to the direction of fluid flow through the memory cooler 100 in this particular example. In other examples, the direction of fluid flow may be reversed and the chamber 200 may become the "outlet" chamber and the chamber 202 the "inlet" chamber. Similarly, in such examples, the hose barb 206 may be the "output" hose barb and the barb 208 may be the "inlet hose barb".

As will be discussed further below, the first end block 110 and second end block 112, in conjunction with the first end cap 104 and the second endcap 106, may define one or more of the inlet chamber 220 and the outlet chamber 202 and—where used— circulations chamber(s). The inlet chamber, outlet chamber, and circulation chamber(s) are fluidly coupled to the flow channels of the heat transfer tubes 108 to define the liquid flow path through the memory cooler 100. The liquid flow path may be either direct or serpentine in various examples, which will in turn determine which chambers are fluidly coupled with the respective flow paths of which heat transfer tubes 108.

Furthermore, the inlet and outlet to the flow path may be in either the first end block 100 or the second end block 112 depending on the particular example implemented. Still further, in some examples, the inlet chamber and the outlet chamber may be defined, at least partially, by the same end block or by different end blocks. Examples of these variations are shown and discussed below relative to FIGS. 7 and 12-14.

The first endcap 104 is affixed to the first end block 110 to define, in conjunction with the first end block 110, the circulation chamber 202. The second endcap 106 is affixed to the second end block 112 to define, in conjunction with the second end block 112, the inlet chamber 200. The affixation may be by, for instance and without limitation, brazing, bonding, welding, etc. The affixation technique should be selected not only for purposes of the affixation, but also for the ability to effect a liquid tight seal to prevent leaks of the liquid coolant.

Figure 5:
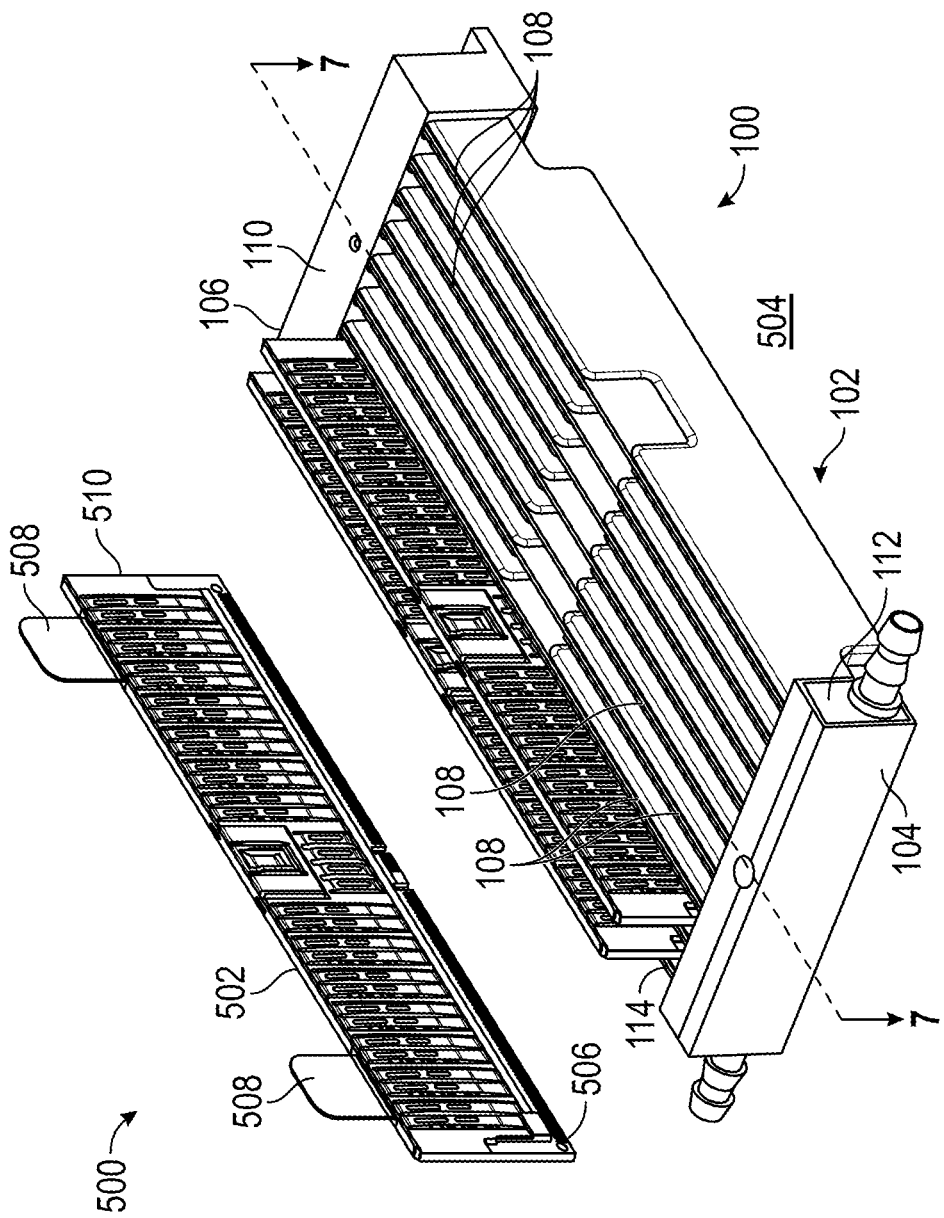
FIG. 5 depicts an assembly including the memory cooler of FIG. 1-FIG. 2 and at least one printed circuit assembly ("PCA").

The memory cooler 100 may be used to cool one or more PCAs in an assembly, such as a computer module. FIG. 5 depicts an assembly 500 including the memory cooler 100 of FIG. 1-FIG. 2 and a plurality of PCAs 502. One jacketed PCA 502 is shown disassembled from the assembly 500 for purposes of illustration. The assembly 500 in this particular example is a compute module that may include other electronics (not shown), such as one or more Central Processing Units ("CPUs"), etc. in furtherance of that role.

The assembly 500 includes a "host" board 504 in this example. The host board 504 is so called because it "hosts" other boards—e.g., boards such as the printed circuit board of the jacketed PCA 502 as will be discussed below. The host board 504 is a printed circuit board ("PCB") that will also include means for electrically connecting the jacketed PCAs 502 to other components of the host board 504. These means may include, for example and without limitation, a plurality of sockets and electrical traces, none of which are shown for the sake of clarity and because of their ubiquity in the art. In the illustrated example, this means includes a female connector (not shown) to mate with the edge connector 506 of the jacketed PCA 502.

The memory cooler 100 is mounted to a host board 504 in a manner not shown. The mounting may be, for example, by fastening the memory cooler 100 to the board using fasteners such as screws, bolts, and the like that are not shown. The first end block 110 and the second end block 112 may be fabricated with mounting holes (not shown) for that specific purpose. However, any suitable mounting technique known to the art may be used.

Figure 6A:
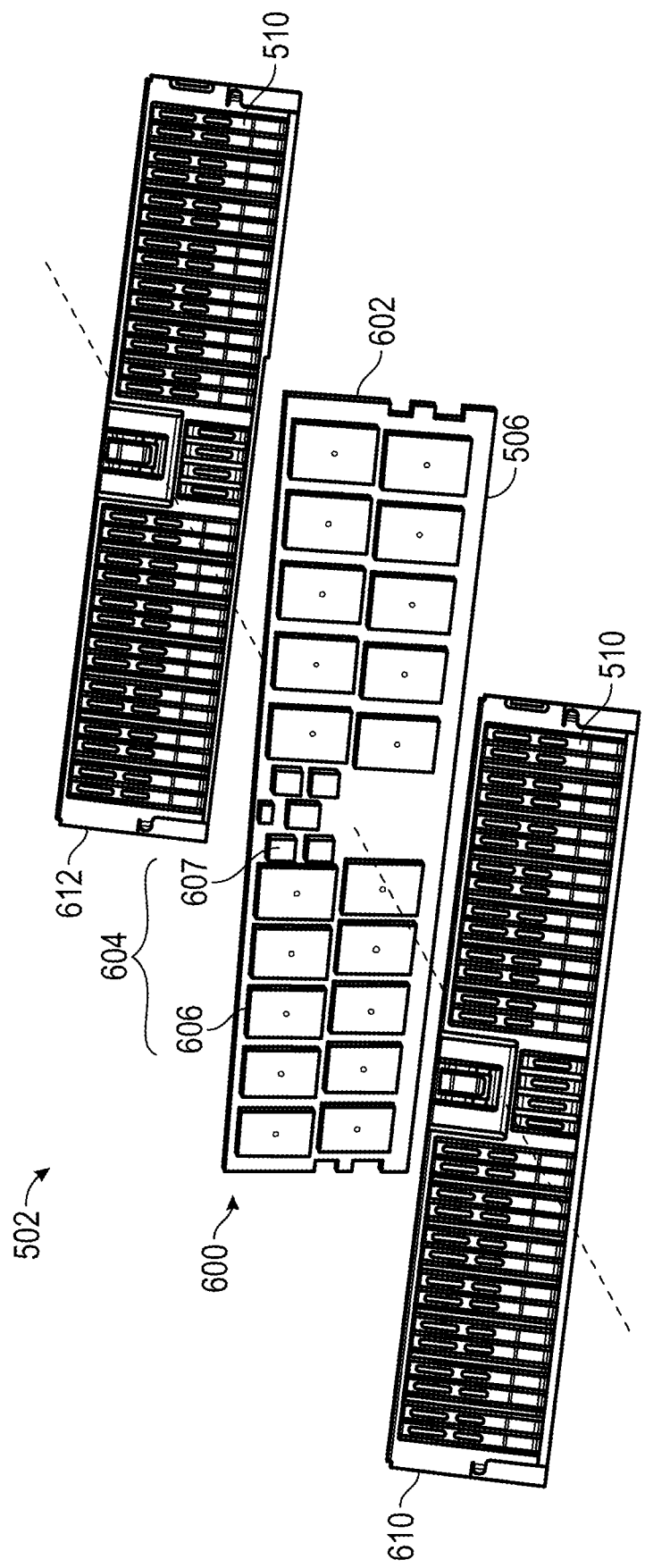
FIG. 6A is an exploded view of the PCA of FIG. 5.

FIG. 6A is an exploded view of the jacketed PCA 502 of FIG. 5. Of pertinence to the present disclosure, the jacketed PCA 502 includes a PCA 600, which in the illustrated example is a memory board. The PCA 600 includes a PCB 602 upon which a plurality of electronic components 604 of various kinds, not all of which are indicated, are mounted. The electronic components 604 include a plurality of memory modules 606. The electronic components 604 and the edge connector 506 are electrically interconnected by a plurality of electrical traces (not shown) and, through the edge connector 506, to other components (not shown) of the host board 504.

The jacketed PCA 502 includes a PCA 600 comprised of a PCB 602 on which are mounted a plurality of electronic components 604. In the illustrated example, the PCA 600 is a memory board and the electronic components 604 are memory modules 606 and capacitors 607, respectively. More particularly, the memory modules 606 are DRAM and the PCA 600 is a DIMM. Note that in other examples the memory modules 606 may be some kind of memory module other than a DIMM. The PCA 600 may also include other kinds of electronic components in addition to or instead of the memory modules 606 and the capacitors 607.

For instance, the PCA 600 may also include inductors (not shown), voltage regulators (also not shown), controllers (again not shown) and the like. In some examples the PCA 600 may be a processor board. In these examples, the electronic components may be processors or other kinds of electronic components that are used to implement the functionality of the processor board. Some examples employing a plurality of jacketed PCAs 502 may include jacketed PCAs 502 in which the constituent PCAs 600 perform different functions.

The jacketed PCA 502 furthermore includes a thermal transfer jacket comprised of, in the illustrated example, a first cover 610 and a second cover 612. The first cover 610 and second cover 612 each include a plurality of leaf springs 510 whose form and function are described more fully below relative to FIGS. 6B-6O. In the illustrated example, the first cover 610 and the second cover 612 are each formed from a single layer of material having a thermal conductivity of at least 350 W/m-K and a thickness of at most 0.25 mm. However, other examples may use more than one layer of material provided that spacing specifications are met, materials having different thermal conductivities, and materials having different thicknesses.

The first cover 610 and the second cover 612 oppose one another to mechanically engage in a manner to encase the PCA 600. When encasing the PCA 600, the thermal transfer jacket mechanically engages with and thermally couples to the PCA 600 in a manner described more fully below. As used herein, to "thermally couple" two objects means to provide a thermally conductive pathway between the objects that allows heat to be conducted between the objects. Two objects may be considered to be thermally coupled if any of the following are true: (1) the two objects are in contact with one another through a "dry" or direct contact, with the contact interface having a thermal resistance of 0.1° C./W or higher, or via a thermal interface material ("TIM") having a thermal conductivity of 3 W/m-K or higher, or (2) the objects are both thermally coupled to a thermal transfer device (or to a chain of thermally coupled thermal transfer devices. A TIM may be a relatively thin, thermally conductive, and compliant (easily deformable) material placed between two devices at their thermal interface to improve heat transfer rates by filling air gaps that would otherwise occur between the devices due to surface roughness and/or misalignment. Common examples of a TIM include thermal gap pads, thermal grease, and thermal paste.

Referring again to FIG. 5, the heat transfer tubes 108 are one kind of thermal transfer device as is the unitary thermal transfer device 102 as a whole. As will be described below relative to FIG. 6C, the heat transfer tubes 108 are thermally coupled and mechanically engaged with the jacketed PCA 502 without being mechanically fastened or otherwise affixed to the jacketed PCA 502. A "thermal transfer device" may be any device that is thermally conductive and that is configured to receive heat from one solid body via conduction (contact) and transfer the heat into a second solid body via conduction (contact). Examples of thermal transfer devices include, but are not limited to, heat pipes, vapor chambers, heat spreaders (such as solid bars or strips of metal), cooling tubes, etc.

The jacketed PCA 502 also includes an optional plurality of pull tabs 508 affixed to the second cover 612. The pull tabs 508 may be used to disassemble the jacketed PCA 502 from the assembly 500. The pull tabs 508 may be fabricated of a flexible material so that they may be bent over. For example, they may be bent as a compute system is disposed in a tray (not shown) and inserted into a rack (also not shown) or other enclosure. Some examples may omit the pull tabs 508.

The jacketed PCA 502 also includes a plurality of leaf springs 510, only one of which is indicated in FIG. 5. More particularly, each of the first cover 610 and the second cover 612 includes a plurality of leaf springs 510. This can be seen in FIG. 6B, where each leaf spring 510 is integral to the first cover 610 or the second cover 612 in the sense they are formed of a single piece therewith.

Figure 6B:
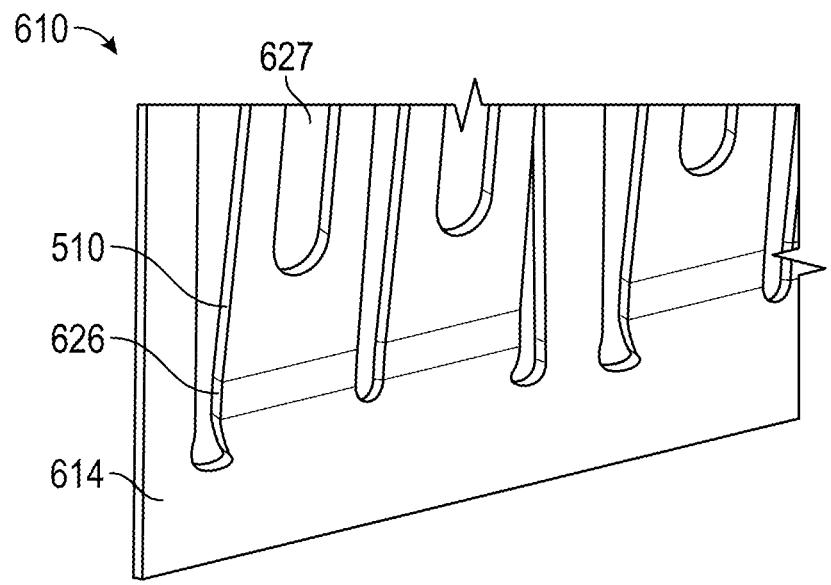
FIG. 6B illustrates selected aspects of the leaf springs of the PCA in FIG. 5.

Turning now to the leaf springs 510, FIG. 6B shows selected details of the construction of the leaf springs 510. FIG. 6B is a perspective, magnified view of part of a bottom edge 614 of a first cover 610 of the thermal jacket that also includes the second cover 612. The leaf springs 510 are captive at both ends. The leaf spring 510 is created by removing material from the first cover 610 on each side of what will become the leaf spring 510. A flexure 626 is then created as is an opening 627. The leaf springs 510 in the second cover 612 may be similar in design and construction.

The unitary thermal transfer device 102, including each of the heat transfer tubes 108, as well as the first cover 610 and the second cover 612 are fabricated from one or more thermally conductive materials. An object, device, or assembly (which may comprise multiple distinct bodies that are thermally coupled, and may include multiple different materials), is "thermally conductive" for purposes of this disclosure if any one of the following is true: (1) the object is a continuous piece of a material that has a thermal conductivity (often denoted k) of 10 W/m-K or greater at any temperature between 0° C. and 100° C., or (2) the object is a heat pipe, vapor chamber, continuous body of copper, or continuous body of aluminum, or continuous body of stainless steel. Those in the art having the benefit of this disclosure will appreciate that thermal conductivity across multiple bodies, sometimes also called effective thermal conductivity, will differ from thermal conductivity across a single body. An object or device comprised of multiple bodies are "thermally conductive" if they exhibit an effective thermal conductivity across the multiple bodies of 5 W/m-K or higher. Examples of materials that are thermally conductive include almost all metals and their alloys (e.g., copper, aluminum, gold, stainless steel, etc.), some plastics (e.g., TECACOMP® TO compounds, COOLPOLY® D-series Thermally Conductive Plastics), and many other materials.

The unitary thermal transfer device 102, first cover 610, and second cover 612, may all be fabricated from the same material or from different materials. For example, the unitary thermal transfer device 102 may be fabricated by printing a material such as stainless steel via 3D printing, while the first cover 610, and the second cover 612 may be stamped from a sheet of metal or metal alloy, such as copper. Factors such as cost and weight may be considerations in material selection in addition to the thermal characteristics discussed. For the unitary thermal transfer device 102, the material should be one that is usable in a 3D printing process.

It will typically be desirable for at least some of these components, such as the unitary thermal transfer device 102, first cover 610, and second cover 612, to be fabricated from one or more materials that are not only thermally conductive, but highly thermally conductive. An object, device, or assembly (which may comprise multiple distinct bodies that are thermally coupled, and may include multiple different materials), is "highly thermally conductive" as that term is used herein if any one of the following is true: (1) the object is a continuous piece of a material that has a thermal conductivity (often denoted k) of 50 W/m-K or greater at any temperature between 0° C. and 100° C., or (2) the object is a heat pipe, vapor chamber, continuous body of copper, or continuous body of aluminum, or a continuous body of stainless steel. Examples of materials whose thermal conductivity is 50 W/m-K or greater between 0° C. and 100° C. include certain types of copper, aluminum, silver, gold, and stainless steel.

Figure 6C:
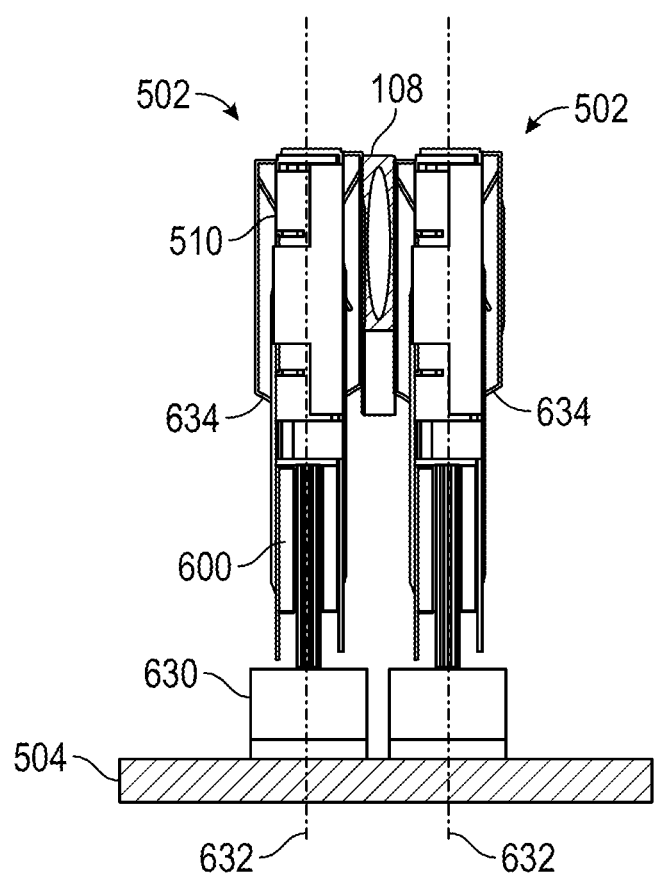
FIG. 6C illustrates the mounting of the PCA(s) of FIG. 5 to the host board therein as well as the mechanical engagement and thermal coupling of the PCA(s) with the heat transfer tubes.

Turning now to FIG. 6C, a pair of jacketed PCAs 502 are illustrated mounted to the host board 504. More particularly, the jacketed PCAs 502 are installed in neighboring electronic sockets 630 of a first printed circuit board 504. The sockets 630 are female connectors and, in conjunction with the slots 108 shown in FIG. 1, form a PCA slot into which the jacketed PCAs 502 may be inserted and installed. Note the presence of the heat transfer tube 108 between the two jacketed PCAs 502 in FIG. 6C, The jacketed PCAs 502 are oriented vertically relative to the force of gravity and the host board 504 is oriented horizontally. This is their nominal orientation in operation, but other examples may use different orientations.

As the jacketed PCAs 502 are inserted into the electronic sockets 630, the leaf springs 510 are compressed inwardly relative to a centerline 632 of each jacketed PCA 502 by surrounding components. In the example of FIG. 6C, the compression of the leaf springs 510 is caused by the mechanical engagement of the thermal transfer jackets 634 with the heat transfer tube 108 and the distance between the two jacketed PCAs 502. Note that such compression may be caused similarly by mechanical engagement with a side rail or a mid-rail. The compression permits the jacketed PCA 502 to "squeeze" into the available space defined by the heat transfer tubes 108, side rails 114, or mid-rail 116, all shown in FIG. 1.

The compression of the leaf springs 510 occurs as the jacketed PCA 502 is inserted into the electronic sockets 630 and helps establish much of the aforementioned thermal coupling. For instance, the compression ensures the physical engagement—and, hence, thermal coupling—between the electronic components 604 and the thermal transfer jacket 634 and, in turn, the thermal transfer jacket 634 physically engages the neighboring structure as described above. Again, this physical engagement also establishes a thermal coupling amongst all these parts of the thermal transfer assembly and the compute system at large.

Figure 7:
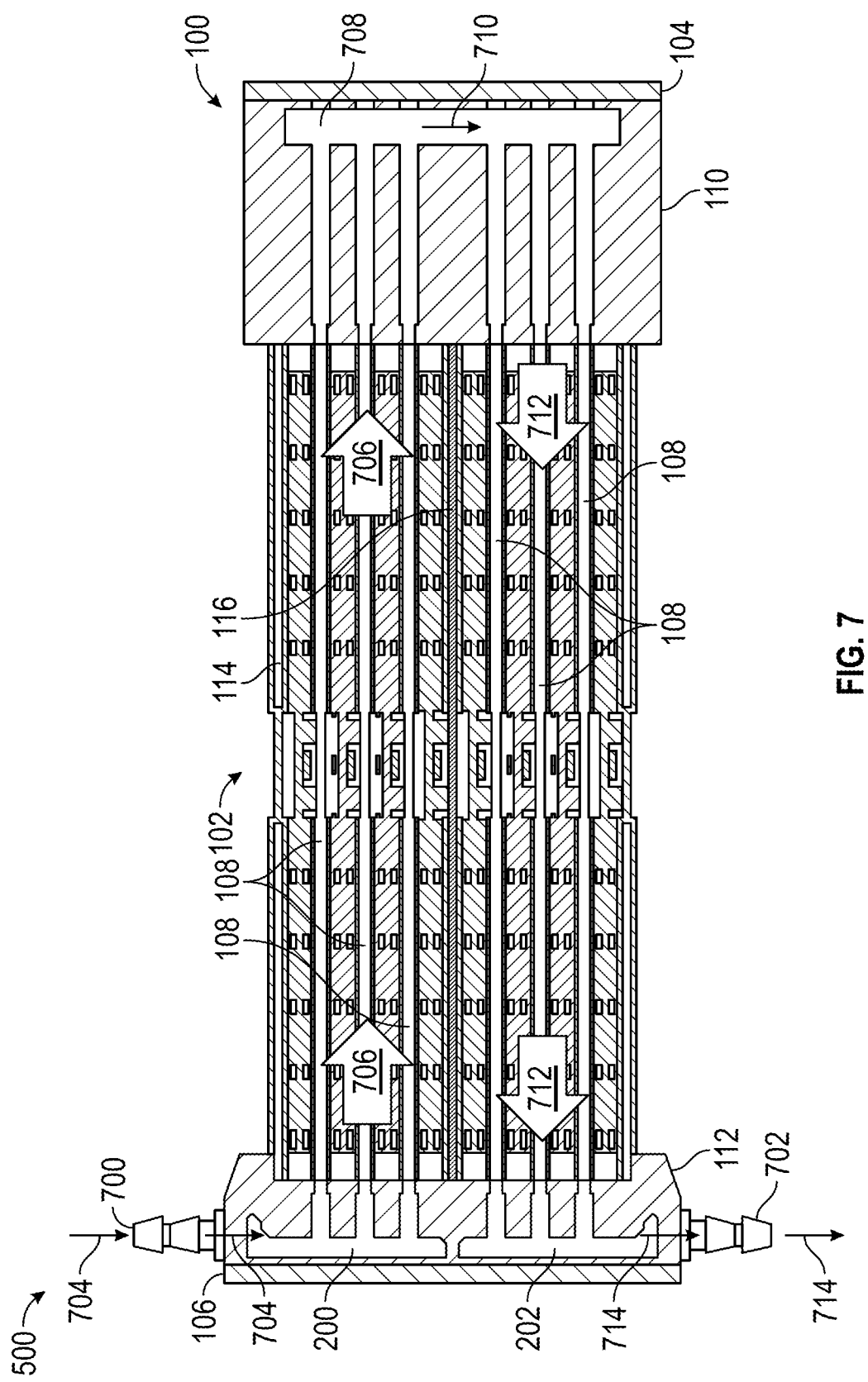
FIG. 7 is a top plan view of an assembly such as the assembly of FIG. 5 partially sectioned along line 7-7 in FIG. 5 and illustrates a coolant flow path according to one or more examples.

FIG. 7 illustrates the liquid coolant flow path through the assembly 500 of FIG. 5 in a partially sectioned, top, plan view of the memory cooler 100 along line 7-7 in FIG. 5. Note that the inlet hose barb 206 and the outlet hose barb 208, both first discussed relative to FIG. 2, are omitted in FIG. 7. Liquid coolant is delivered to and carried away from the memory cooler 100 by a separate subsystem not shown. The terms "top" and "bottom" in the following discussion are relative to the presentation of the assembly in FIG. 7.

Received liquid coolant, then, flows into the memory cooler 100 through the inlet 700 of the second end block 112 as indicated by the arrow graphical element 704. The liquid coolant then flows into and through the inlet chamber 200 into the "top" three heat transfer tubes 108 to flow from the second end block 112 to the first end block 110 as indicated by the arrow graphical elements 706. The liquid coolant flows into the circulation chamber 708 and downward as indicated by the arrow graphical element 710 to flow into the "bottom" three heat transfer tubes 108. The liquid coolant then flows through the bottom three heat transfer tubes 108 from the first block 110 to the second block 112 as indicated by the graphical arrow elements 712. The liquid coolant then flows into the outlet chamber 202 and out of the memory cooler 100 through the outlet 702 as indicated by the arrow graphical elements 714.

While the liquid coolant flows in this path, heat generated by the electronic components 604, shown in FIG. 6A, is transferred into the liquid coolant. The electronic components 604 are thermally coupled to the liquid coolant by virtue of the mechanical engagement of the electronic components 604 with the thermal transfer jacket 634, shown best in FIG. 6O, and the mechanical engagement of the thermal transfer jackets 634 with the heat transfer tubes 108. Each of these mechanical engagements also establishes a thermal coupling through which, collectively, heat from the electronic components 604 is transferred away by the liquid coolant.

The memory cooler 100, first shown in FIG. 1, is 3D printed as is discussed above. This is one reason that the illustrated examples for the memory cooler 100 are fabricated from stainless steel—it is a 3D printable material. (Stainless steel is also thermally conductive, relatively sturdy, and relatively lightweight in this application.) An overview of the 3D printing process will now be presented.

3D printing is one form of what is commonly and generally referred to as additive manufacturing. An additive manufacturing process is desirable in this context because the memory cooler 100 is designed to minimize the number of parts that are assembled. One aspect of this constraint is that the unitary thermal transfer device 102 is manufactured as a single piece as discussed above. The design of the unitary thermal transfer device 102 does not lend itself to manufacture in a single piece by traditional fabrication methods such as stamping, casting, extruding, etc. commonly used in conventional processes. Additive manufacturing processes are able to overcome the drawbacks afflicting the conventional processes.

A 3D printing process fabricates an end product through one of several types of processes, such as direct metal laser sintering. The process uses a digital 3D model of the end product to "build" the end product. The metal powder is deposited in a selected pattern governed by the digital 3D model one layer at a time. Once the powder is deposited, the 3D printer alters the physical state of the powder to solidify it. For instance, in direct metal laser sintering, the 3D printer uses a laser to melt deposited metal powder and the melted metal powder turns solid. This proceeds one layer at a time until the product build is completed.

Figure 8:
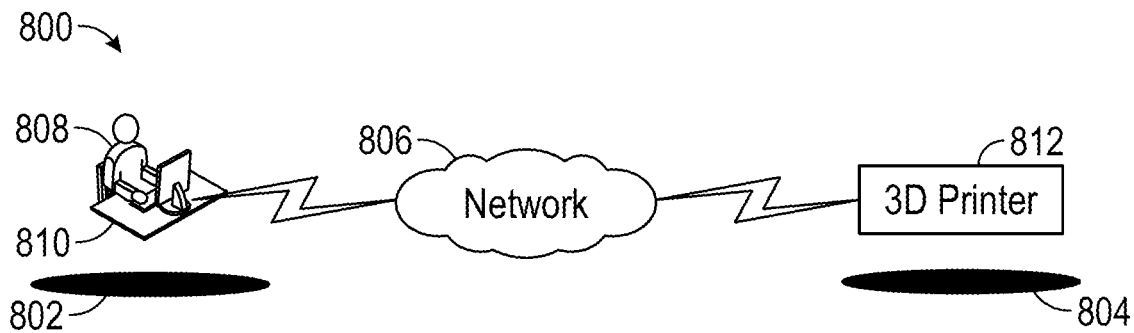
FIG. 8 illustrates a system by which a memory cooler such as the memory cooler of FIG. 1-FIG. 2 may be designed and fabricated.

FIG. 8 illustrates one particular example of a system 800 by which the memory cooler 100 may be 3D printed. The system 800 includes at least a design facility 802 and a manufacturing facility 804 communicating over a network 806. Those in the art having the benefit of this disclosure will appreciate that this level of discussion omits some detail in the implementation of the system 800. Such detail as is omitted is omitted for the sake of clarity and so as not to obscure that which is claimed below. In some examples, the design and fabrication may occur in the same facility and communications need not occur over a network in all examples. The network 806 in this example is a public network, such as the Internet, with a private or secured connection.

Figure 9:
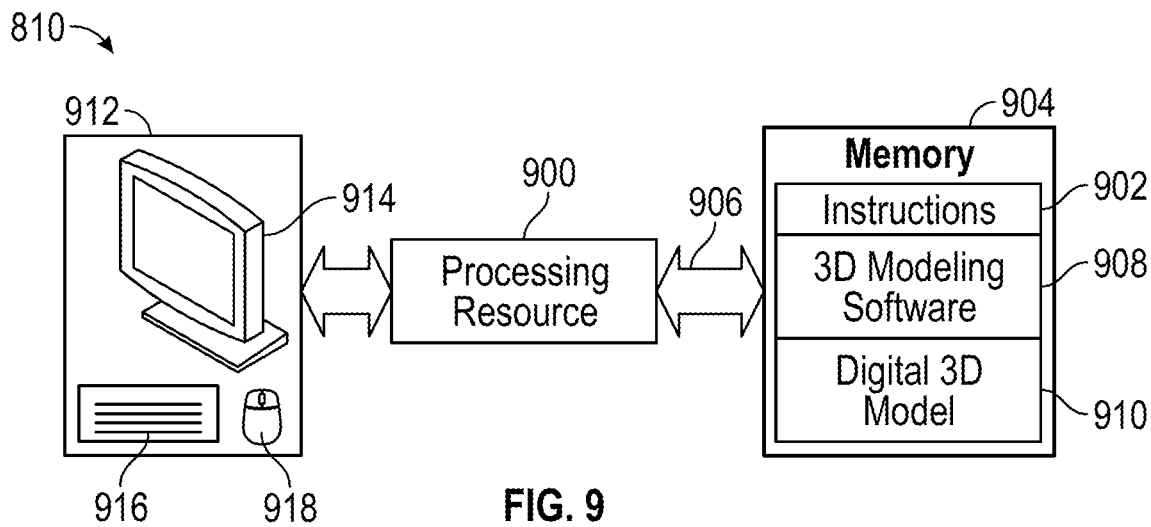
FIG. 9 is a block diagram illustrating one particular example of a design station as may be implemented in the system of FIG. 8.

A designer 808 at a design station 810 develops a digital 3D model of the memory cooler 100. FIG. 9 illustrates one particular example of the design station 810. As with the system 800 in FIG. 8, selected, routine details of the design station 810 not germane to the process under discussion are omitted for the sake of clarity and so as not to obscure that which is claimed below. The design station 810 may be, for instance, a computing apparatus including a programmed processing resource 900, such as a processor. The processor may be a Central Processing Unit ("CPU") or a processor chipset. The processing resource 900 may alternatively be, for instance, a programmed Application Specific Integrated Circuit ("ASIC") or Electrically Erasable Programmable Read Only Memory ("EEPROM") in other examples.

In the illustrated example, the processing resource 900 is a CPU programmed with instructions 902 residing in a memory 904 that the processing resource communicates with over a bus 906. The memory 904 may be Random Access Memory ("RAM"), Read Only Memory ("ROM"), or more likely some combination of the two. The memory 904 also has residing thereon a 3D modeling software 908 and, once developed, a digital 3D model 910.

The designer 808 invokes the 3D modeling software 908 through a user interface 912 including, for instance, a display 914, a keyboard 916, and a pointing device 918. The 3D modeling software 908 may be any suitable 3D modeling software known to the art. One popular 3D modeling software is SOLIDWORKS™ commercially available from Dassault Systemes. However, other computer aided design ("CAD") and/or computer aided engineering ("CAE") software packages may be used. The designer 808 then designs the digital 3D model 910 using the 3D modeling software 908. Note that, since the memory cooler 100 comprises three parts in this example, the digital 3D model 910 will model not only the memory cooler 100 as a whole, but also the three parts of the memory cooler 100 separately.

Referring now to FIG. 8 and FIG. 9 collectively, once the digital 3D model 910 is developed, the designer 808 exports the digital 3D model 910 to one or more 3D printers 812 in the manufacturing facility 804. Those ordinarily skilled in the art will appreciate that, in order to achieve desired throughput and amount of product, examples may include multiple 3D printers. Furthermore, although the discussion herein includes serial production of the unitary thermal transfer device 102, first endcap 104, and second endcap 106, other examples may include parallel production of these components. The present discussion has chosen to focus on a single 3D printer used in serial production for the sake of clarity and so as not to obscure that which is claimed below.

Figure 10:
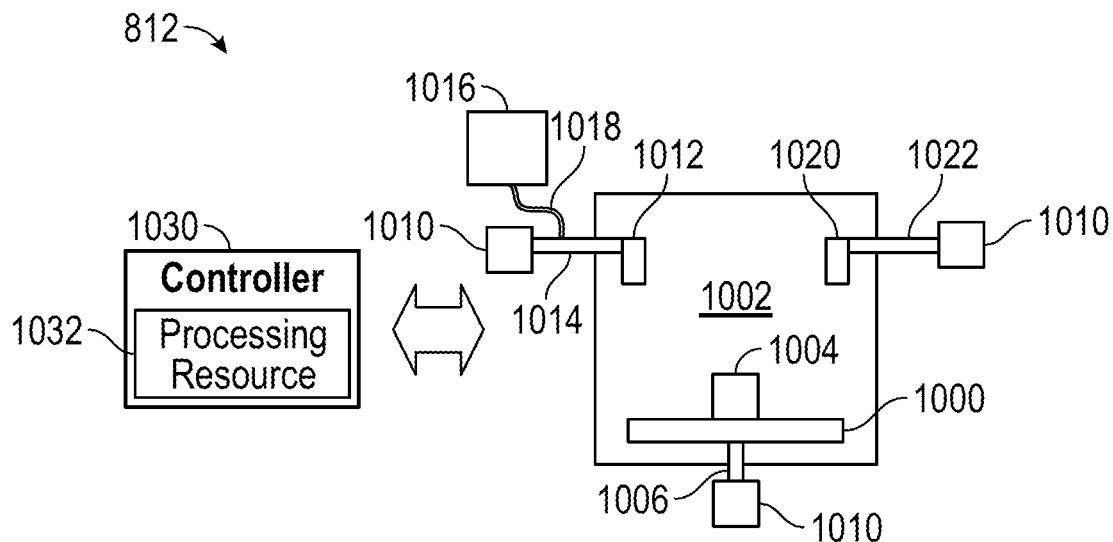
FIG. 10 is a block diagram illustrating one particular example of a 3D printer as may be implemented in the system of FIG. 8.

FIG. 10 illustrates one particular example of the 3D printer 812, shown in FIG. 8, with which the system 800 may be implemented. As with the system 800 in FIG. 8 and the design station 810 in FIG. 9, selected, routine details of the 3D printer 812 not germane to the process under discussion are omitted for the sake of clarity and so as not to obscure that which is claimed below. The 3D printer includes a stage 1000 in a chamber 1002 on which the product 1004 is fabricated. The stage 1000 may rotate in some examples upon a shaft 1006 driven by a motor 1010. In this example, the product 1004 may be any one of the unitary thermal transfer device 102, first endcap 104, and second endcap 106, all shown in FIG. 1, depending on the stage of fabrication.

The 3D printer 812 also includes a deposition subsystem and a printing subsystem. The deposition subsystem includes a deposition head 1012 mounted to a boom 1014 that may be driven through two or three degrees of motion by a motor 1010. The deposition head 1012 is fed deposition material (e.g., a powdered metal) from a hopper 1016 through a feed 1018. The printing subsystem includes a printer head 1020 mounted to a boom 1022 that may also be driven through two or three degrees of motion by a motor 1010.

The 3D printer 812 also includes a processor-based controller 1030. Note that, in a computing context, the term "controller" has a definite, structural connotation to those in the art—namely, a processor-based apparatus that operates under programmed control to perform programmed functions. The controller 1030 in this example includes a processing resource 1032 that may be, for instance, a microcontroller. The processing resource 1032 may alternatively be a CPU, a processor chipset, an ASIC, or an EEPROM. The processing resource 1032 executes instructions derived from the exported digital 3D model 910, shown in FIG. 9, to control the motors 1010 and fabricate the product 1004 one layer at a time. The instructions may be stored in a memory (not shown), such as the memory 904 in FIG. 9, of the controller 1030 or may be received over a networked connection from other parts of a computing system (not otherwise shown) for the manufacturing facility 804, shown in FIG. 8.

Figure 11:
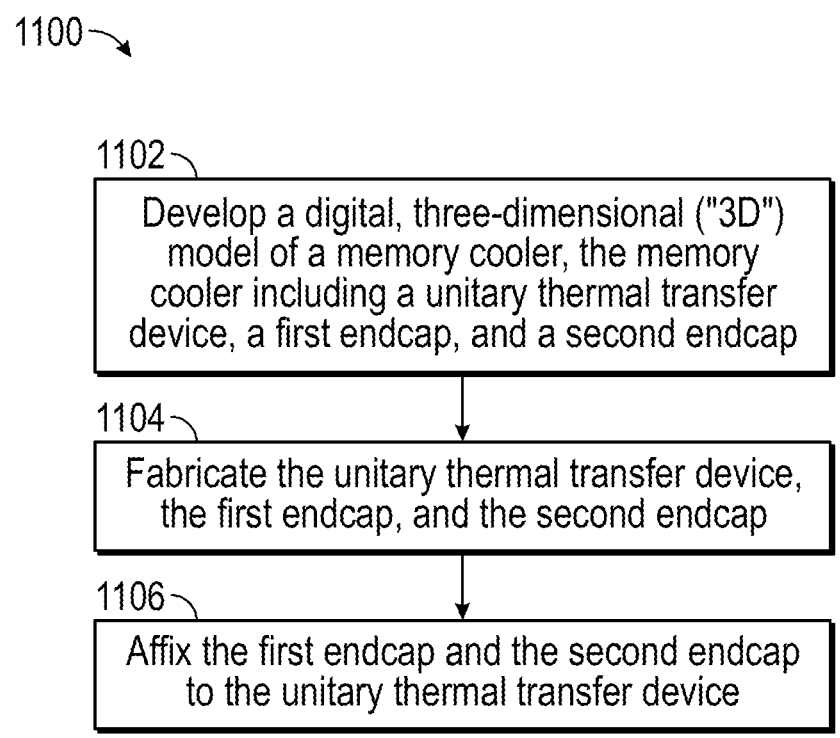
FIG. 11 illustrates a method of fabrication as may be implemented in one or more examples of the present disclosure.

Thus, in one example, the memory cooler 100 of FIG. 1 may be fabricated using the process 1100 shown in FIG. 11. The process 1100 begins by developing (at 1102) a digital, three-dimensional ("3D") model, such as the digital 3D model 910, shown in FIG. 9, of a memory cooler, such as the memory cooler 100 in FIG. 1-FIG. 2. The process 1100 then 3D prints (at 1104) the unitary thermal transfer device, the first endcap, and the second endcap of the memory cooler. The process 1100 concludes by affixing (at 1106) the first endcap and the second endcap to the unitary thermal transfer device. As noted above, the presentation of the steps in FIG. 11 and the recitation of steps in the claims below does not necessarily imply any particular order on the fabrication of the memory cooler. The steps may be performed serially in a different order or performed in parallel.

Returning to FIG. 1-FIG. 2, the examples disclosed above therefore use 3D printed, stainless steel for the bulk of the memory cooler, the memory cooler having only three parts. The reduced part count for each memory cooler results in a significantly reduced number of potential leak points, a solution that is easier to manufacture and assemble, is lighter weight, and ultimately low cost. The examples also include a greater number of coolant channels that result in low pressure drop. Still further, because the unitary thermal transfer device is made as a unitary object, the use of the TIM can be omitted and thereby improve the thermal conductivity that would have otherwise had to go through some sort of junction and utilize a TIM.

Figure 12:
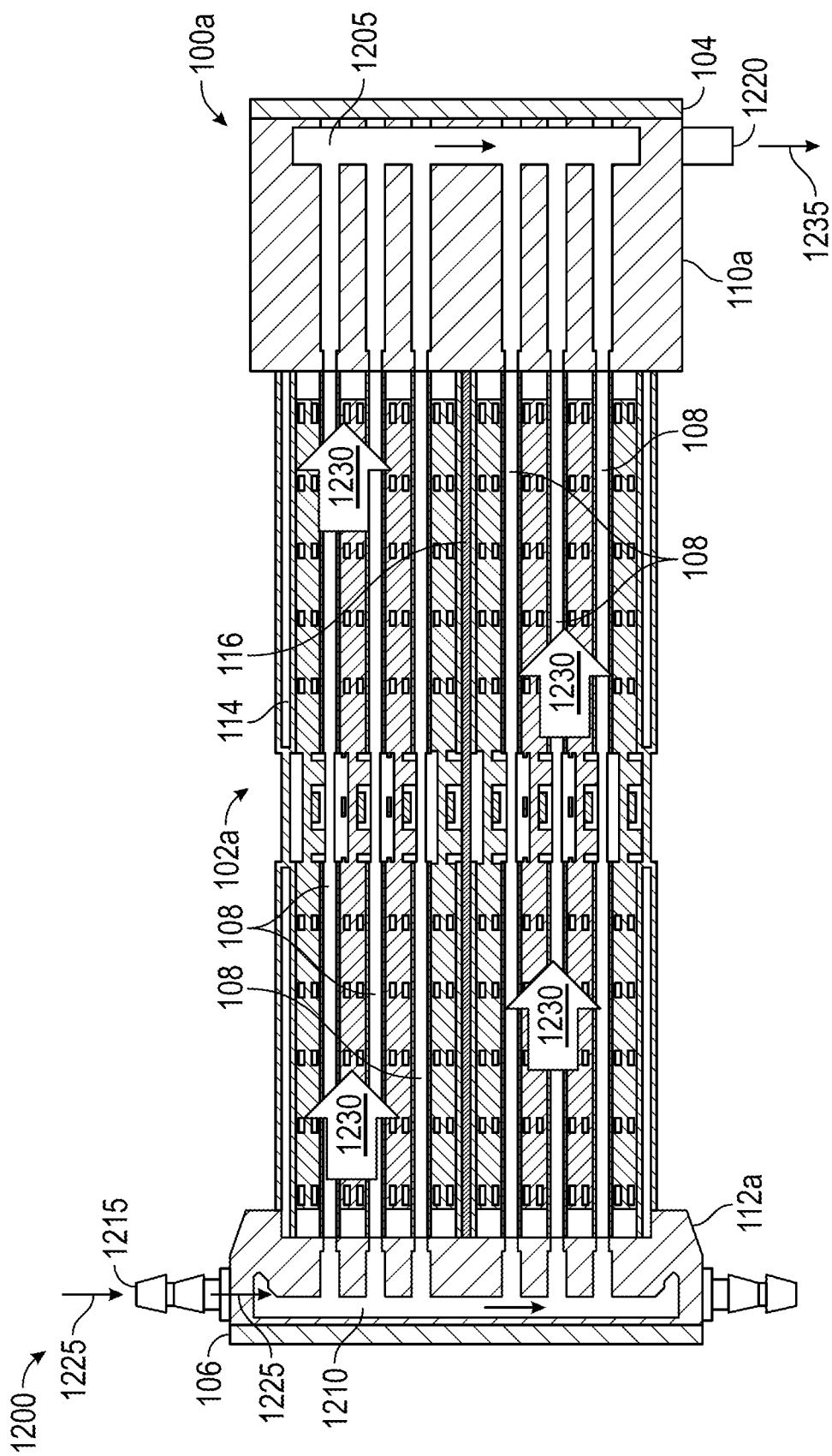
FIG. 12 is a top plan view of another sectioned assembly illustrating a coolant flow path according to one or more examples.
Figure 13:
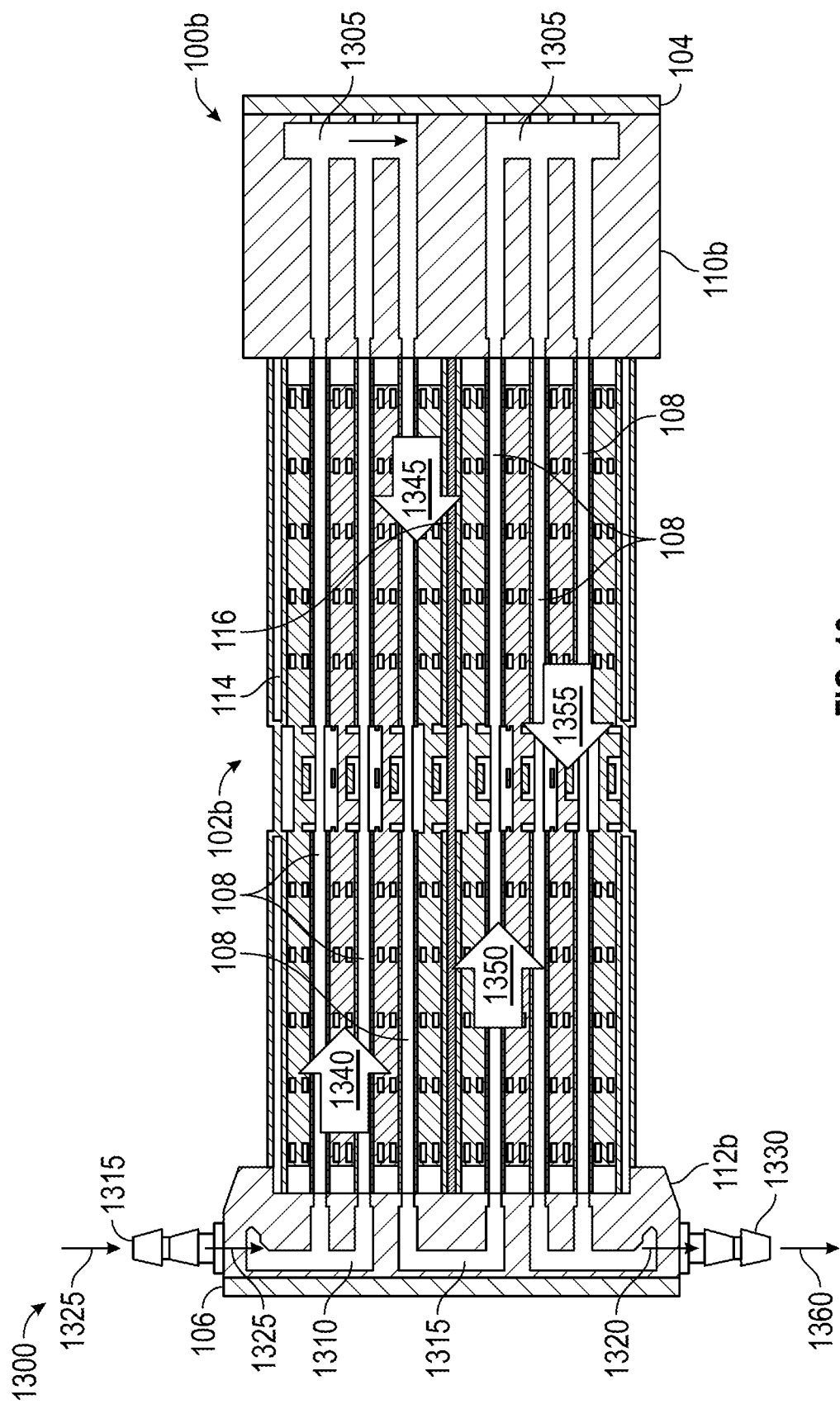
FIG. 13 is a top plan view of another sectioned assembly illustrating a coolant flow path according to one or more examples.
Figure 14:
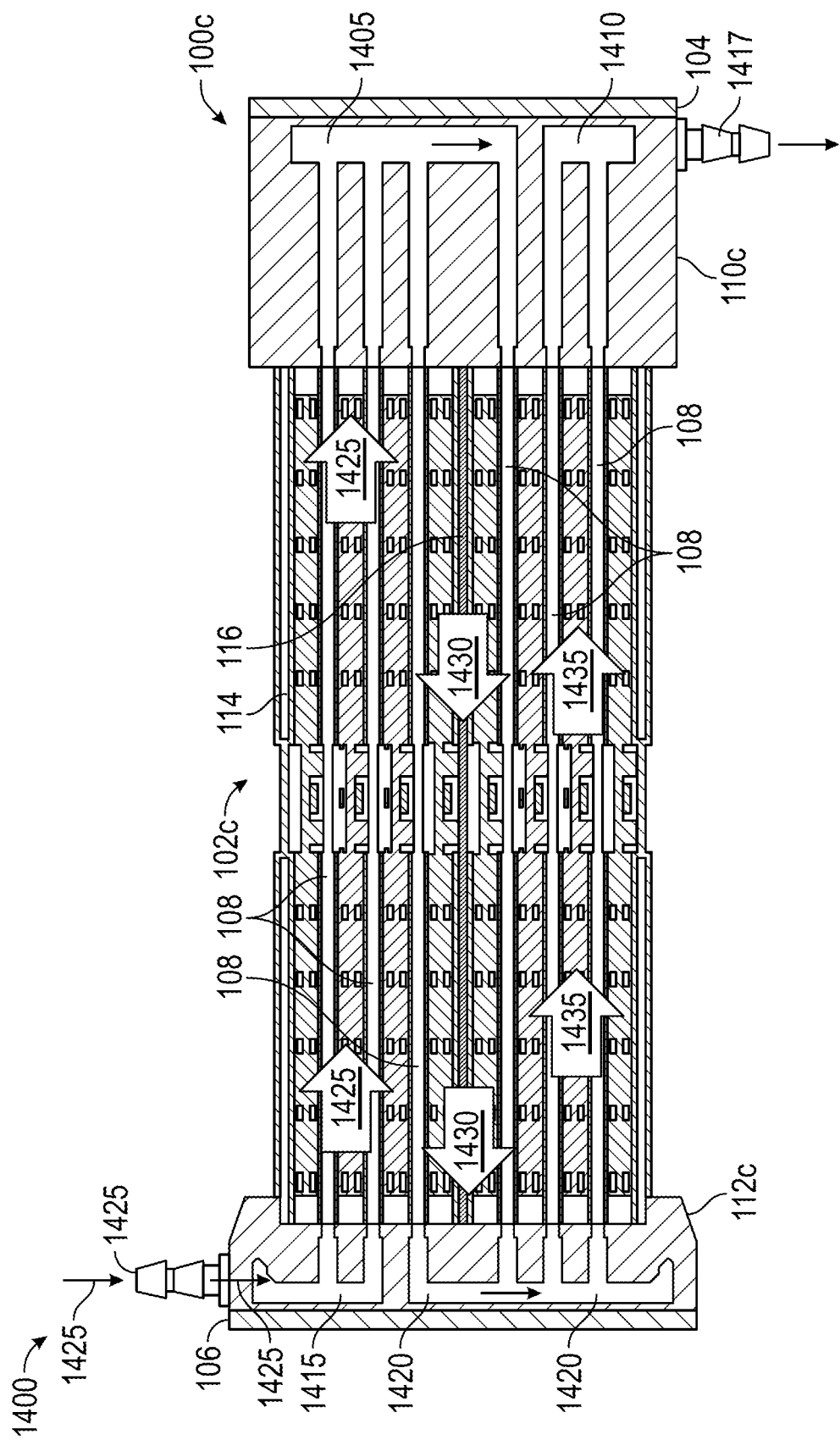
FIG. 14 is a top plan view of another sectioned assembly illustrating a coolant flow path according to one or more examples.

The subject matter claimed below also admits variation in the flow path of the liquid coolant through the memory cooler as was discussed above. Several examples of how the flow path may be varied are shown in FIGS. 12-14. These variations in the flow path implicate variation in the structure of the unitary thermal transfer device as will now be discussed.

FIG. 12 is a top plan view of a sectioned assembly 1200 illustrating a coolant flow path according to one or more examples. In this particular example, the memory cooler 100a includes unitary thermal transfer device 102a, a first end block 110a, a second end block 112a, and a plurality of heat transfer tubes 108. The first end block 110a defines an outlet chamber 1205 and the second end block 112a defines an inlet chamber 1210 in conjunction with the first endcap 104 and the second end cap 106, respectively. The inlet chamber 1210 is in fluid communication with the inlet 1215 and the outlet chamber 1205 is in fluid communication with the outlet 1220.

Both the inlet chamber 1210 and the outlet chamber 1205 are each in fluid communication with each respective liquid flow channel of each of the heat transfer tubes 108. Received liquid coolant enters the inlet 1215 as indicated by the arrow graphical element 1225, enters the inlet chamber 1210, flows through the heat transfer tubes 108 from the inlet chamber 1210 to the outlet chamber 1205 as indicated by the arrow graphical elements 1230, and then exits through the outlet 1220 as indicated by the arrow graphical element 1235. The fluid flow path between the inlet 1215 and the outlet 1220 therefore is direct rather than serpentine as in FIG. 7. There consequently is no circulation chamber in this example.

FIG. 13 is a top plan view of another sectioned assembly 1300 illustrating a coolant flow path according to one or more examples. In this particular example, the memory cooler 100b includes unitary thermal transfer device 102b, a first end block 110b, a second end block 112b, and a plurality of heat transfer tubes 108. The first end block 110b, in conjunction with the first endcap 104, defines a plurality of circulation chambers 1305, each circulation chamber 1305 in fluid communication with at least one of the heat transfer tubes 108. The second end block 112b, in conjunction with the second endcap 106, defines an inlet chamber 1310, a plurality of circulation chambers 1315, and an outlet chamber 1320. Each of the inlet chamber 1310, the circulation chambers 1315, and the outlet chamber 1320 are in fluid communication with at least one liquid flow channel of the heat transfer tubes 108. The inlet chamber 1310 is in fluid communication with the inlet 1325 and the outlet chamber 1320 is in fluid communication with the outlet 1330.

Thus, in the example of FIG. 13, received liquid coolant enters the inlet chamber 1310 through the inlet 1325 as indicated by the arrow graphical element 1335, and flows through the heat transfer tubes 108 to the first circulation chamber 1305. The circulation chambers 1305, 1315, and the heat transfer tubes 108 establish a serpentine flow pattern as indicated by the arrow graphical elements 1340, 1345, 1350, and 1355. The serpentine flow path terminates in the outlet chamber 1320 from whence it exits the unitary thermal transfer device 100b through the outlet 1330 as indicated by the arrow graphical element 1360.

FIG. 14 is a top plan view of another sectioned assembly 1400 illustrating a coolant flow path according to one or more examples. In this particular example, the memory cooler 100c includes unitary thermal transfer device 102c, a first end block 110c, and a second end block 112c, and a plurality of heat transfer tubes 108. The first end block 110c defines a circulation chamber 1405 and an outlet chamber 1410. The second end block 112c defines an inlet chamber 1415 and a plurality of circulation chambers 1420.

Liquid coolant enters the inlet chamber 1415 through the inlet 1425. The heat transfer tubes 108 and circulation chambers 1420, 1405 define a serpentine flow path as indicated by the arrow graphical elements 1425, 1430, 1435. After flowing through the serpentine flow path, the liquid coolant enters the outlet chamber 1410 and exits the unitary thermal transfer device 100c through the outlet 1417.

Those in the art having the benefit of this disclosure will appreciate that still other flow paths may be implemented in other examples. The flow path can be designed by the number and placement of circulation chambers (if any) as well as the location and placement of the inlet and outlet along with the concomitant inlet and outlet chambers. Some examples may even employ multiple inlets and/or outlets with either direct or serpentine flow paths.

Each of the inlet chamber and outlet chamber therefore is fluidly coupled with at least one respective liquid flow channel of at least one of the heat transfer tubes. In some embodiments—e.g., the direct flow path embodiment of FIG. 12—the inlet chamber and the outlet chamber are fluidly coupled to the same flow channel(s) of the same heat transfer tube(s). In some other embodiments—e.g., the serpentine flow path embodiments of FIGS. 7 and 13-14—the inlet chamber and the outlet chamber may be fluidly coupled to the respective liquid flow channels of different heat transfer tubes. These embodiments will employ circulation chambers that are also fluidly coupled to the liquid flow channels of the various heat transfer tubes. The circulation chambers help define the serpentine flow path and permit the liquid coolant to circulate through the unitary thermal device from the inlet to the outlet.

The following patent application is hereby incorporated by reference for the teachings therein regarding the design and fabrication of jacketed PCAs, such as the jacketed PCA 502 in FIG. 5, to the extent not inconsistent with the disclosure herein:

U.S. application Ser. No. 17/237,732, filed Apr. 21, 2021, in the name of the inventors John Franz and Ernesto Ferrer, and entitled, "Temperature Control of Closely Packed Electronic Assemblies", which is commonly assigned herewith.

In the event of conflict between the incorporated application and the present disclosure, the present specification, including definitions, controls.

This concludes the detailed description. The particular examples disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the invention. Accordingly, the protection sought herein is as set forth in the claims below.

What is claimed:

1. A memory cooler, including:
 a unitary thermal transfer device including:
  a plurality of heat transfer tubes, each heat transfer tube having a first tube end and a second tube end and defining a respective liquid flow channel;
  a first end block structurally integrated with each of the heat transfer tubes at a respective first tube end of the at least one heat transfer tube;
  a second end block structurally integrated with each of the heat transfer tubes at a respective second tube end;
  an inlet chamber partially defined by the second end block, the inlet chamber fluidly coupled with at least one respective liquid flow channel of at least one of the heat transfer tubes;
  an inlet to the inlet chamber;
  an outlet chamber partially defined by the first end block, the outlet chamber fluidly coupled with at least one respective liquid flow channel of at least one of the heat transfer tubes; and
  an outlet from the outlet chamber;

a first endcap, the first endcap affixed to the first end block to define, in conjunction with the first end block, the outlet chamber and at least a first circulation chamber; and a second endcap, the second endcap affixed to the second end block to define, in conjunction with the second end block, the inlet chamber and at least a second circulation chamber.

2. The memory cooler of claim 1, wherein the at least one respective liquid flow channel to which the inlet chamber is fluidly coupled is the at least one respective liquid flow channel to which the outlet chamber is fluidly coupled.

3. The memory cooler of claim 1, wherein:
the at least one respective liquid flow channel of the at least one heat transfer tube is defined by a respective interior surface of the at least one heat transfer tube; and
the interior surface includes a plurality of surface extensions.

4. The memory cooler of claim 1, wherein the at least one respective liquid flow channel has a rounded rectangular-shaped cross-section.

5. The memory cooler of claim 1, wherein each of the heat transfer tubes is structurally integrated to the first end block at the respective first tube end and to the second end block at the respective second tube end.

6. An assembly, comprising:
a host printed circuit board ("PCB");
a memory cooler mounted to the host PCB, the memory cooler including:
a unitary thermal transfer device including:
a plurality of heat transfer tubes, each heat transfer tube having a first tube end and a second tube end and defining a respective liquid flow channel;
a first end block structurally integrated with each of the heat transfer tubes at a respective first tube end of the at least one heat transfer tube;
a second end block structurally integrated with each of the heat transfer tubes at a respective second tube end;
an inlet chamber partially defined by the second end block, the inlet chamber fluidly coupled with at least one respective liquid flow channel of at least one of the heat transfer tubes;
an inlet to the inlet chamber;
an outlet chamber partially defined by the first end block, the outlet chamber fluidly coupled with at least one respective liquid flow channel of at least one of the heat transfer tubes; and
an outlet from the outlet chamber; and
a first endcap, the first endcap affixed to the first end block to define, in conjunction with the first end block, the outlet chamber and at least a first circulation chamber;
a second endcap, the second endcap affixed to the second end block to define, in conjunction with the second end block, the inlet chamber and at least a second circulation chamber; and
a plurality of memory boards plugged into the host board, each memory board being disposed in a respective slot defined by the heat transfer tubes of the unitary thermal transfer device.

7. The assembly of claim 6, wherein:
the at least one respective liquid flow channel of the at least one heat transfer tube is defined by a respective interior surface of the at least one heat transfer tube; and
the interior surface includes a plurality of surface extensions.

8. The assembly of claim 6, wherein the at least one respective liquid flow channel has a rounded rectangular-shaped cross-section.

9. The assembly of claim 6, wherein each of the heat transfer tubes is structurally integrated to the first end block at the respective first tube end and to the second end block at the respective second tube end.

10. The assembly of claim 6, further comprising a central processing unit ("CPU") plugged into the host PCB.

11. A memory cooler, including:
a unitary thermal transfer device including:
a plurality of heat transfer tubes, each heat transfer tube having a first tube end and a second tube end and defining a respective liquid flow channel;
a first end block structurally integrated with each of the heat transfer tubes at a respective first tube end of the at least one heat transfer tube;
a second end block structurally integrated with each of the heat transfer tubes at a respective second tube end;
an inlet chamber partially defined by the second end block, the inlet chamber fluidly coupled with at least one respective liquid flow channel of at least one of the heat transfer tubes;
an inlet to the inlet chamber;
an outlet chamber partially defined by the second end block, the outlet chamber fluidly coupled with at least one respective liquid flow channel of at least one of the heat transfer tubes; and
an outlet from the outlet chamber;
a first endcap, the first endcap affixed to the first end block to define, in conjunction with the first end block, at least a first circulation chamber and a second circulation chamber; and
a second endcap, the second endcap affixed to the second end block to define, in conjunction with the second end block, the outlet chamber, the inlet chamber, and at least a third circulation chamber.

12. The memory cooler of claim 11, wherein the at least one respective liquid flow channel to which the inlet chamber is fluidly coupled is the at least one respective liquid flow channel to which the outlet chamber is fluidly coupled.

13. The memory cooler of claim 11, wherein:
the at least one respective liquid flow channel of the at least one heat transfer tube is defined by a respective interior surface of the at least one heat transfer tube; and
the interior surface includes a plurality of surface extensions.

14. The memory cooler of claim 11, wherein the at least one respective liquid flow channel has a rounded rectangular-shaped cross-section.

15. The memory cooler of claim 11, wherein each of the heat transfer tubes is structurally integrated to the first end block at the respective first tube end and to the second end block at the respective second tube end.

* * * * *